(12) United States Patent
Kim

(10) Patent No.: US 11,395,082 B2
(45) Date of Patent: Jul. 19, 2022

(54) VEHICLE AND CONTROLLING METHOD THEREOF

(71) Applicants: Hyundai Motor Company, Seoul (KR); Kia Motors Corporation, Seoul (KR)

(72) Inventor: Youngbeom Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/991,696

(22) Filed: Aug. 12, 2020

(65) Prior Publication Data

US 2021/0266689 A1 Aug. 26, 2021

(30) Foreign Application Priority Data

Feb. 21, 2020 (KR) ................. 10-2020-0021464

(51) Int. Cl.
*H04R 29/00* (2006.01)
*H04R 1/02* (2006.01)
*H04R 1/40* (2006.01)
*H04R 3/12* (2006.01)
*H03F 3/183* (2006.01)
*H03G 3/30* (2006.01)

(52) U.S. Cl.
CPC ........... *H04R 29/002* (2013.01); *H03F 3/183* (2013.01); *H03G 3/3005* (2013.01); *H04R 1/025* (2013.01); *H04R 1/403* (2013.01); *H04R 3/12* (2013.01); *H03F 2200/03* (2013.01); *H03G 2201/103* (2013.01); *H04R 2201/028* (2013.01); *H04R 2499/13* (2013.01)

(58) Field of Classification Search
CPC combination set(s) only.
See application file for complete search history.

(56) References Cited

U.S. PATENT DOCUMENTS

| 9,276,530 | B1 * | 3/2016 | Liu ................. H03F 3/2171 |
| 2008/0215240 | A1 * | 9/2008 | Howard ............. G01C 21/36 701/469 |
| 2010/0278346 | A1 * | 11/2010 | Hogue ............... H04R 3/14 381/18 |
| 2011/0081032 | A1 * | 4/2011 | Soulodre ........... H04S 1/002 381/300 |
| 2014/0063064 | A1 * | 3/2014 | Seo ............. G08G 1/096775 345/633 |

(Continued)

*Primary Examiner* — Duc Nguyen
*Assistant Examiner* — Assad Mohammed
(74) *Attorney, Agent, or Firm* — Fox Rothschild LLP

(57) ABSTRACT

A vehicle and a controlling method of the same controlling an output of a speaker based on a mutual influence between a plurality of speakers provided on a crush pad are provided. The vehicle includes a crush pad, a first speaker provided on the crush pad, and a second speaker provided on the crush pad and positioned on one side of the first speaker. An amplifier supplies current to the first speaker and the second speaker and a detector detects the current of the first speaker and the current of the second speaker. A controller is configured to compensate a movement of the second speaker caused by an operation of the first speaker based on an output of the detector when a current is supplied to the first speaker among the first speaker and the second speaker.

18 Claims, 7 Drawing Sheets

(56) References Cited

U.S. PATENT DOCUMENTS

| | | | | |
|---|---|---|---|---|
| 2017/0072869 A1* | 3/2017 | Ito | ............................ | H04R 5/023 |
| 2017/0096104 A1* | 4/2017 | Kelly | ....................... | G08G 1/166 |
| 2018/0324524 A1* | 11/2018 | Hezar | ........................ | H03F 1/32 |
| 2018/0338202 A1* | 11/2018 | Hagen | ........................ | H04R 1/24 |
| 2019/0011959 A1* | 1/2019 | Yazaki | .................. | G06F 1/1688 |
| 2019/0028077 A1* | 1/2019 | Watanabe | .................. | H03F 1/52 |

* cited by examiner

VEHICLE AND CONTROLLING METHOD THEREOF

CROSS-REFERENCE TO RELATED APPLICATION(S)

This application is based on and claims priority under 35 U.S.C. § 119 to Korean Patent Application No. 10-2020-0021464, filed on Feb. 21, 2020, the disclosure of which is incorporated by reference in its entirety.

BACKGROUND

1. Technical Field

The present disclosure relates to a vehicle, and more particularly, to a vehicle in which a plurality of speakers are provided on a crush pad.

2. Description of the Related Art

A vehicle may include a plurality of speakers to provide sound to a user, and may operate the plurality of speakers to output sound signals corresponding to audio/video/navigation (AVN) devices. In particular, the vehicle may include a center speaker disposed in the center of a crush pad to form a sound image for the sound signal of the AVN device on the windshield glass side, and may include an Ecall speaker that outputs a sound signal of Emergency call provided on the side of the center speaker. In other words, the crash pad may include a center speaker and an Ecall speaker, and distortion to another speaker may occur based on the output from one speaker.

SUMMARY

In view of the above, an aspect of the present disclosure provides a vehicle and a control method thereof capable of controlling an output of speaker based on a mutual influence of a plurality of speakers provided on a crush pad.

In accordance with an aspect of the present disclosure, a vehicle may include a crush pad; a first speaker disposed on the crush pad; a second speaker disposed on the crush pad and positioned on one side of the first speaker; an amplifier configured to supply current to the first speaker and the second speaker; a detector configured to detect the current of the first speaker and the current of the second speaker; and a controller configured to compensate a movement of the second speaker caused by an operation of the first speaker based on an output of the detector when a current is supplied to only the first speaker among the first speaker and the second speaker.

The controller may be configured to determine an induced current induced in the second speaker according to the operation of the first speaker based on the output of the detector. The controller may be configured to operate the amplifier to supply a direct current (DC) current exceeding the induced current to the second speaker. The controller may be configured to operate the amplifier so that the first speaker outputs sound corresponding to an audio/video/navigation (AVN) device. The controller may be configured to operate the amplifier so that the second speaker outputs received sound from an external device when an accident occurs.

Additionally, the controller may be configured to operate the amplifier so that the current is not supplied to the first speaker when the accident occurs. The controller may be configured to determine whether the current is induced in the first speaker according to the operation of the second speaker based on the output of the detector. Further, the controller may be configured to operate the amplifier so that current is not supplied to the first speaker since it is determined that an accident has occurred when current is induced in the first speaker. The controller may be configured to determine whether the current is induced in the first speaker according to the operation of the second speaker by comparing a pre-stored induced current information and the current of the first speaker according to the output of the detector. The first speaker and the second speaker may share the internal space of the crush pad as an enclosure.

In accordance with an aspect of the present disclosure, a controlling method of a vehicle including a crush pad, a first speaker disposed on the crush pad, a second speaker disposed on the crush pad and positioned on one side of the first speaker, an amplifier configured to supply current to the first speaker and the second speaker, a detector configured to detect the current of the first speaker and the current of the second speaker, the method may include compensating a movement of the second speaker caused by an operation of the first speaker based on an output of the detector when a current is supplied to only the first speaker among the first speaker and the second speaker.

Compensating the movement of the second speaker may include determining an induced current induced in the second speaker according to the operation of the first speaker based on the output of the detector. Additionally, compensating the movement of the second speaker may include operating the amplifier to supply a DC current exceeding the induced current to the second speaker.

The method may further include operating the amplifier so that the first speaker outputs sound corresponding to an audio/video/navigation (AVN) device. Additionally, the method may include operating the amplifier so that the second speaker outputs received sound from an external device when an accident occurs. The method may further include operating the amplifier so that the current is not supplied to the first speaker when the accident occurs.

Operating the amplifier so that the current is not supplied to the first speaker may include determining whether the current is induced in the first speaker according to the operation of the second speaker based on the output of the detector. Operating the amplifier so that the current is not supplied to the first speaker may include operating the amplifier so that current is not supplied to the first speaker since it is determined that an accident has occurred when current is induced in the first speaker.

Determining whether the current is induced in the first speaker may include determining whether the current is induced in the first speaker according to the operation of the second speaker by comparing a pre-stored induced current information and the current of the first speaker according to the output of the detector. The first speaker and the second speaker may share the internal space of the crush pad as an enclosure.

According to a vehicle and a controlling method according to one aspect, by operating the output of the speaker based on the mutual influence between the plurality of speakers provided on the crush pad, distortion of the output can be minimized.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Figure 1:
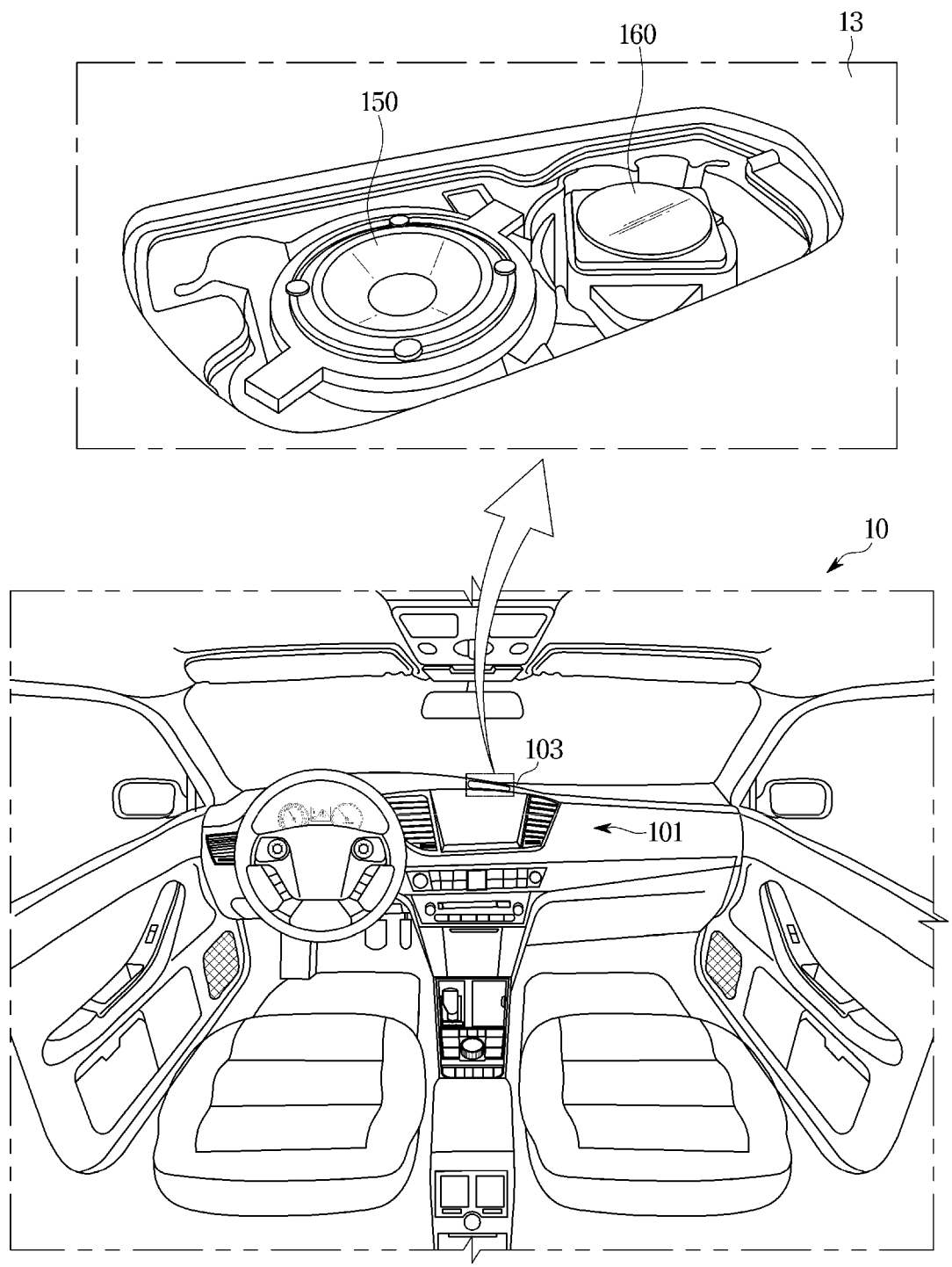
FIG. 1 illustrates an interior of a vehicle according to an exemplary embodiment.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Like reference numerals refer to like elements throughout. The present disclosure does not describe all elements of the exemplary embodiments, and overlaps between the general contents or the embodiments in the technical field to which the present invention belongs.

This specification does not describe all elements of the exemplary embodiments of the present disclosure and detailed descriptions on what are well known in the art or redundant descriptions on substantially the same configurations may be omitted. The term 'part, module, member, block' used in the specification may be implemented in software or hardware, and a plurality of 'part, module, member, block' may be embodied as one component, It is also possible that one 'part, module, member, block' includes a plurality of components.

Throughout the specification, when an element is referred to as being "connected to" another element, it may be directly or indirectly connected to the other element and the "indirectly connected to" includes being connected to the other element via a wireless communication network. In addition, when a part is said to "include" a certain component, this means that it may further include other components, except to exclude other components unless otherwise stated.

Throughout the specification, when a member is located "on" another member, this includes not only when one member is in contact with another member but also when another member exists between the two members. The terms first, second, etc. are used to distinguish one component from another component, and the component is not limited by the terms described above. Singular expressions include plural expressions unless the context clearly indicates an exception. In each step, the identification code is used for convenience of description, and the identification code does not describe the order of each step. Each of the steps may be performed out of the stated order unless the context clearly dictates the specific order.

Hereinafter, with reference to the accompanying drawings will be described the working principle and embodiments of the present invention.

FIG. 1 illustrates an interior of a vehicle according to an exemplary embodiment; Referring to FIG. 1, inside the vehicle 10 according to an exemplary embodiment, the interior of the vehicle 10 and the engine room are partitioned, and a dashboard 101 corresponding to a panel on which various parts necessary for driving are installed is provided.

The dashboard 101 may include a crush pad 103 corresponding to an upper panel, and the crush pad 103 may be disposed inside the driver's seat and the passenger seat, and may include foaming agent to protect passengers in case of an accident. The crush pad 103 may include a first speaker 150 configured to output sound corresponding to an audio/video/navigation (AVN) device, and a second speaker 160 configured to output sound corresponding to an emergency call (Ecall).

Specifically, a groove may be provided in the crush pad 103, and the first speaker 150 and the second speaker 160 may be mounted in the groove. Accordingly, the first speaker 150 and the second speaker 160 may share the inner space of the crush pad 103 as an enclosure. The first speaker 150 and the second speaker 160 may be distorted to the output sound according to the mutual influence. The vehicle 10 may compensate for distortion caused by mutual influence between the first speaker 150 and the second speaker 160, and will be described in detail below.

Figure 2:
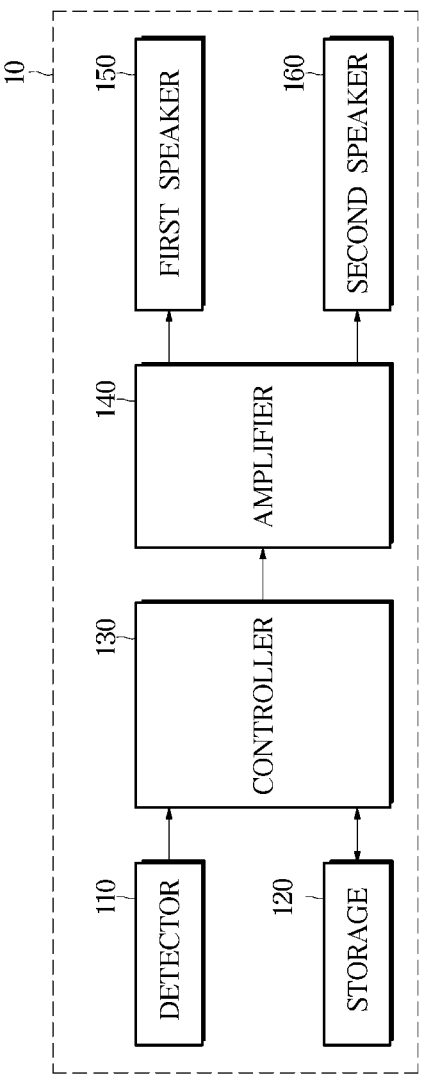
FIG. 2 illustrates a control block diagram according to an exemplary embodiment.
Figure 3:
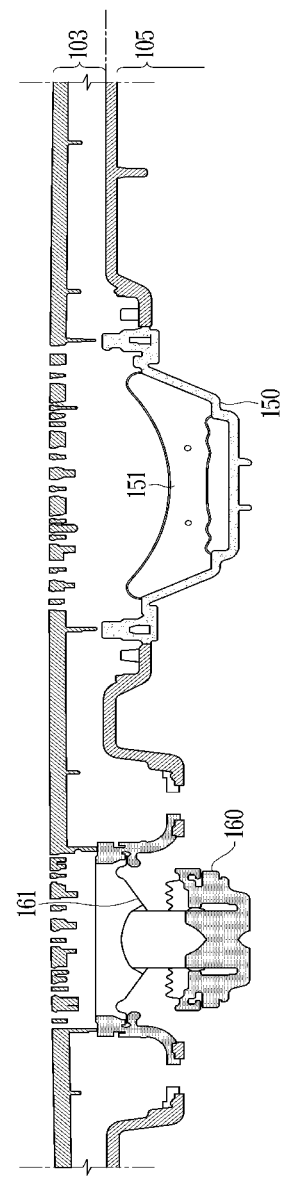
FIG. 3 is a cross-sectional view of a first speaker and a second speaker according to an exemplary embodiment.

FIG. 2 illustrates a control block diagram according to an exemplary embodiment; FIG. 3 is a cross-sectional view of a first speaker and a second speaker according to an exemplary embodiment. Referring to FIG. 2, the vehicle 10 may include a detector 110 configured to detect current of the speaker 150, 160, a storage 120 configured to store various information necessary for control, a controller 130 configured to compensate for distortion in the speakers 150 and 160, an amplifier 140 configured to supply current to the speakers 150 and 160 under the operation of controller 130, and a first speaker 150 provided on the crush pad 130 and a second speaker 160 provided on a crush pad 103 disposed on one side of the first speaker 160.

The detector 110 according to an exemplary embodiment may be configured to sense the current of the speakers 150 and 160. Specifically, the detector 110 may be configured to detect a current flowing through a voice coil (not shown) of the speakers 150 and 160. The detector 110 may include an end connected to the voice coil, and may be configured to sense a current in the voice coil through the end. Accordingly, as the detector 110, an ammeter of a known type may be used. In particular, the detector 110 may separately provide an ammeter configured to sense the current of the first speaker 150 and an ammeter configured to sense the current of the second speaker 160, the current of each of the first speaker 150 and the second speaker 160 may be sensed.

In the above, the detector 110 has been described as detecting the current of the speakers 150 and 160, but is not limited thereto. The detector 110 may also be configured to measure the voltage (voltage applied to the voice coil) of the speakers 150 and 160. The storage 120 according to an exemplary embodiment may be configured to store an algorithm for compensating distortion in the speakers 150 and 160, and induction current information, such as information about a current that may be generally induced in the first speaker 150 may be stored. At this time, the induced current information may be information about a current that may be induced to the first speaker 150 due to noise during normal driving, not an accident. Storage 120 may be a storage medium of a known type, there is no limitation on the type of storage 120.

The controller 130 according to an exemplary embodiment may be configured to operate the amplifier 140 to supply current to the speakers 150 and 160. Specifically, the controller 130 may be configured to operate the amplifier 140 so that the first speaker 150 outputs sound corresponding to the AVN device. In other words, the controller 130 may be configured to operate the amplifier 140 to supply the current corresponding to the sound required to be output by the AVN device to the first speaker 150.

In addition, the controller 130 may be configured to operate the amplifier 140 so that the second speaker 160 outputs sound received from an external device in the event of an accident. In other words, when the emergency telephone system (e.g., the Ecall unit) operates according to an accident, the controller 130 be configured to operate the amplifier 140 to supply a current corresponding to the voice received from the terminal of the rescue center such as a police station or a fire station to the second speaker 160.

At this time, the amplifier 140 may be configured to transmit sound signals to the speakers 150 and 160 under the operation of the controller 130. In other words, the amplifier 140 may be configured to supply currents corresponding to the sound signals to the speakers 150 and 160. In particular, the amplifier 140 may include a plurality of amplifiers corresponding to each of the first speaker 150 and the second speaker 160, and may be provided as one integrated amplifier according to exemplary embodiments. The amplifier 140 may be configured to supply voltage to the speakers 150 and 160 according to an exemplary embodiment.

The controller 130 according to an exemplary embodiment may be configured to prevent distortion that may occur in each of the first speaker 150 and the second speaker 160. Specifically, when current is supplied to only the first speaker 150 among the first speaker 150 and the second speaker 160, the controller 130 may be configured to compensate for the movement of the second speaker 160 caused by the operation of the first speaker 150 based on the output of the detector 110. In other words, the controller 130 may be configured to determine an induced current induced in the second speaker 160 according to the operation of the first speaker 150 based on the output of the detector 110, and operate the amplifier 140 to supply the direct current (DC current) exceeding the induced current to the second speaker 160.

In addition, the controller 130 according to an exemplary embodiment may be configured to operate the amplifier 140 to prevent the current from being supplied to the first speaker 150 in the event of an accident. Specifically, the controller 130 may be configured to receive an accident occurrence signal from components (e.g., airbags, Ecall units) in vehicle 10 when an accident occurs, and stop supplying current to the first speaker 150 so that only the second speaker 160 operates. However, in the event of an accident, the wired connection or wireless connection between the component in the vehicle 10 and the controller 130 may be configured to transmit an accident signal to the controller 130 may be broken based on the degree of damage to the vehicle 10, in this case, the controller 130 may not receive an accident occurrence signal, and may be configured to continue to supply current to the first speaker 150.

Accordingly, the controller 130 may be configured to recognize the occurrence of an accident even in a situation in which a wired connection or a wireless connection between a component in the vehicle 10 that transmits an accident occurrence signal to the controller 130 and the controller 130 is disconnected. Then, the controller 130 may be configured to determine whether current is induced to the first speaker 150 according to the operation of the second speaker 160 based on the output of the detector 110 to stop the current supply to the first speaker 150. And when the current is induced to the first speaker 150 according to the operation of the second speaker 160, the controller 130 may be configured to determine that an accident has occurred and operate the amplifier 140 so that no current is supplied to the first speaker 150.

At this time, the controller 130 may be configured to compare the pre-stored induction current information and the current of the first speaker 150 according to the output of the detector 110 to determine whether current is induced in the first speaker 150 according to the operation of the second speaker 160. The controller 130 may include at least one memory in which programs for performing the above-described operations and the operations described below are stored, and at least one processor for executing the stored programs. In the case of a plurality of memory and processors, it may be possible that they are integrated in one chip, and it may be also possible to be provided in a physically separate location.

The first speaker 150 and the second speaker 160 according to an exemplary embodiment may be provided in the crush pad 103, and as illustrated in FIG. 3, the inner space 105 of the crush pad 103 is shared as an enclosure. The first speaker 150 and the second speaker 160, as they share the enclosure, may have mutual effects, and thus, may cause distortion in each speaker 150, 160. When either the first speaker 150 or the second speaker 160 is operated, a pressure change in the inner space 105 of the crush pad 103 may be caused, and the pressure change in the other speaker may occur.

Specifically, when the vibrating plate 151 of the first speaker 150 vibrates according to the operation of the voice coil according to the current supply, a pressure change in the internal space 105 is caused to vibrate the vibrating plate 161 of the second speaker 160. Conversely, when the vibrating plate 161 of the second speaker 160 vibrates according to the operation of the voice coil according to the current supply, a pressure change in the internal space 105 is caused. Therefore, vibration in the vibrating plate 151 of the first speaker 150 may be caused.

Figure 4:
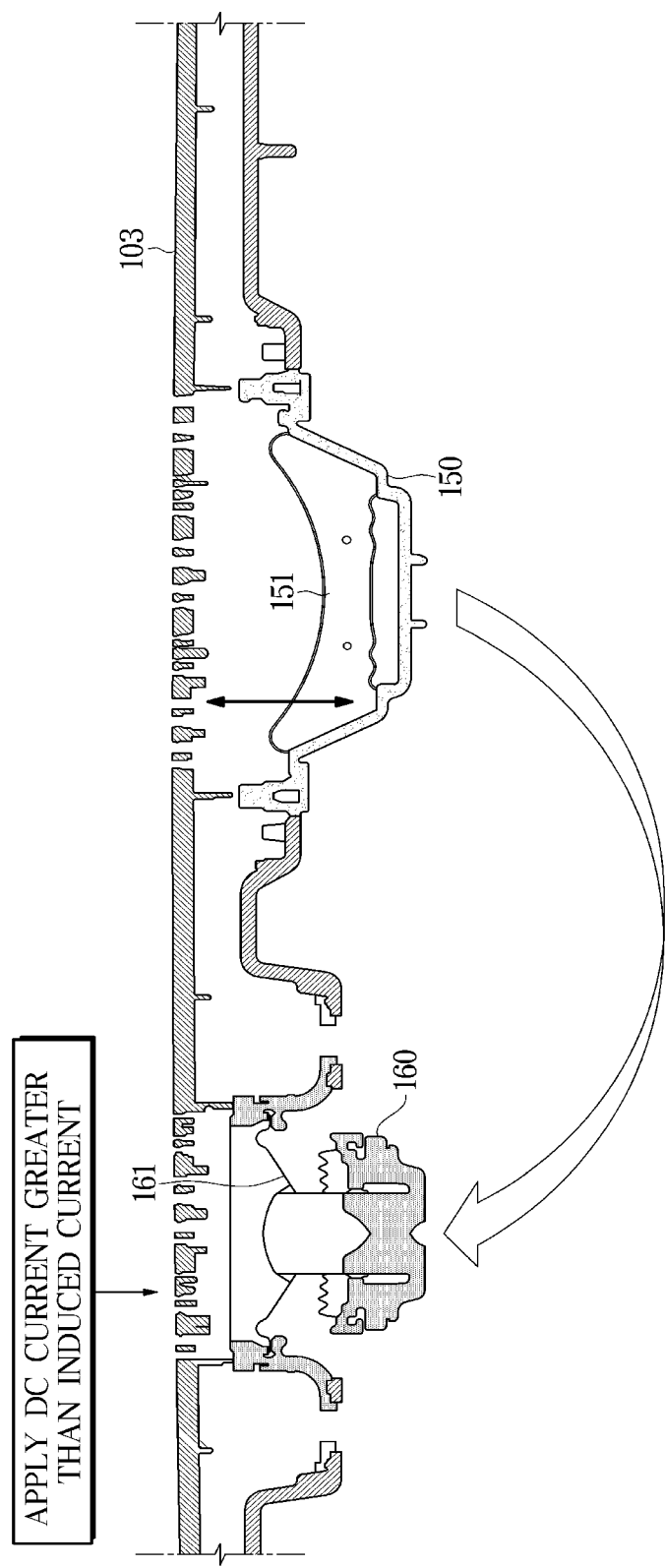
FIG. 4 is a diagram for explaining that the current is induced to the second speaker according to the operation of the first speaker according to an exemplary embodiment.

Hereinafter, a method for compensating for distortion due to mutual influences of the speakers 150 and 160 will be described in detail. FIG. 4 is a diagram illustrating that the current is induced to the second speaker 160 according to the operation of the first speaker 150 according to an exemplary embodiment. Referring to FIG. 4, the controller 130 may be configured to operate the amplifier 140 so that the first speaker 150 outputs sound corresponding to the AVN device. In other words, the controller 130 may be configured to operate the amplifier 140 to supply the current corresponding to the sound required to be output by the AVN device to the first speaker 150.

Particularly, the vibrating plate 151 of the first speaker 150 may vibrate according to the operation of the voice coil according to the current supply. At this time, a pressure change in the inner space 105 of the crush pad 103 may be caused by the vibration of the vibrating plate 151 of the first speaker 150, vibration of the vibrating plate 161 of the second speaker 160 may be caused based on the pressure change in the interior space 105. Finally, as the operation in the second speaker 160 is triggered, unwanted noise may be output from the second speaker 160. In other words, according to the operation of the first speaker 150, the vibrating plate 161 of the second speaker 160 may vibrate, and accordingly, the voice coil of the second speaker 160 may vibrate to generate an induced current.

The controller 130 may be configured to determine whether the operation of the second speaker 160 is triggered according to the operation of the first speaker 150 by sensing the induced current of the second speaker 160, and execute the operation of the second speaker 160 to be prevented. In other words, when current is supplied to only the first speaker 150 among the first speaker 150 and the second speaker 160, the controller 130 may be configured to compensate for the movement of the second speaker 160 which is triggered according to the operation of the first speaker 150 based on the output of the detector 110.

Specifically, the controller 130 may be configured to determine an induced current induced in the second speaker 160 according to the operation of the first speaker 150 based on the output of the detector 110, and operate the amplifier 140 to supply the DC current exceeding the induced current to the second speaker 160. In other words, the controller 130 may be configured to operate the amplifier 140 to supply the direct current to the voice coil of the second speaker 160 that exceeds the maximum size of the induced current induced in the second speaker 160, the vibrating plate 161 of the second speaker 160 is fixed in a direction corresponding to the direct current to prevent the vibrating plate 161 from vibrating according to the induced current. Thus, the vehicle 10, by supplying a direct current to prevent the operation of the second speaker 160, prevents the output from the first speaker 150 generating noise.

Figure 5:
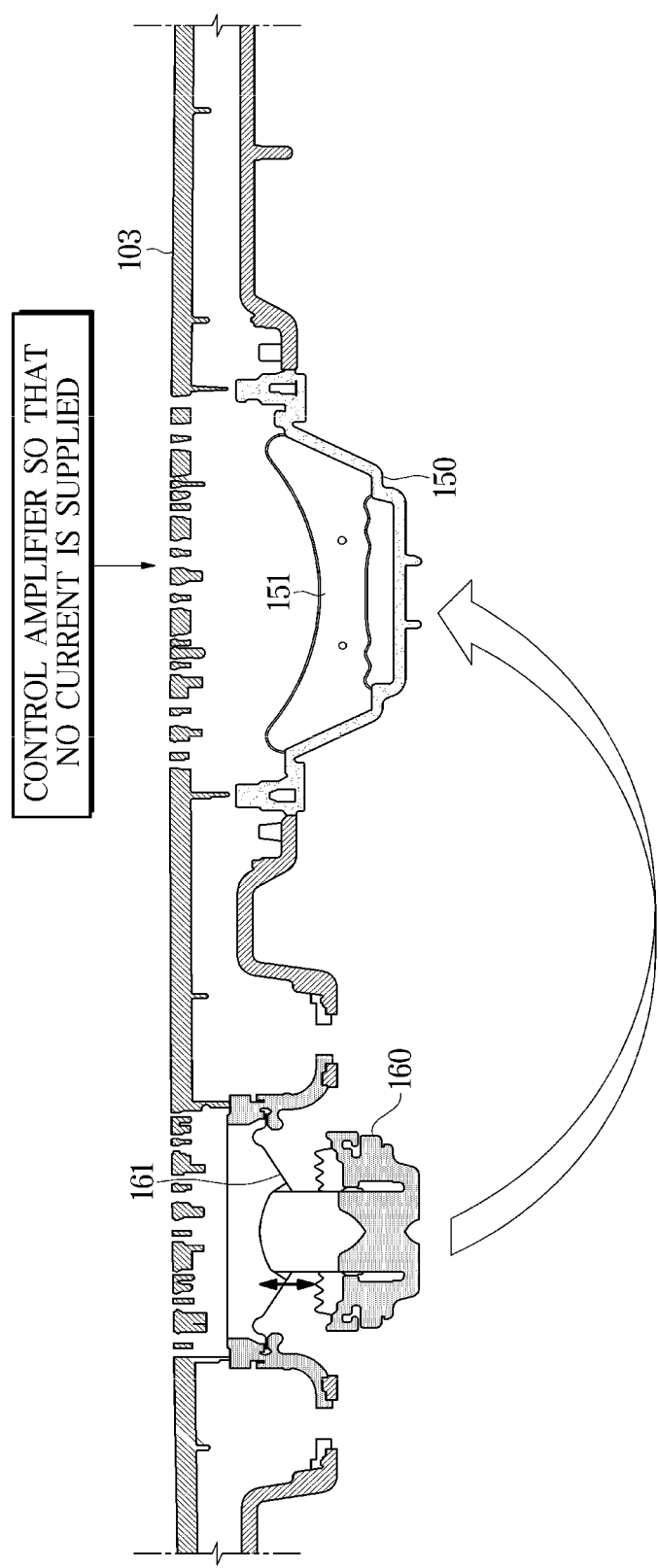
FIG. 5 is a diagram for explaining that the current is induced to the first speaker according to the operation of the second speaker according to an exemplary embodiment.

FIG. 5 is a diagram illustrating that the current is induced to the first speaker 150 according to the operation of the second speaker 160 according to an exemplary embodiment. Referring to FIG. 5, the controller 130 according to an exemplary embodiment may be configured to operate the amplifier 140 so that the second speaker 160 outputs a sound received from an external device when an accident occurs. In other words, when the emergency telephone system (for example, the Ecall unit) operates in response to an accident, the controller 130 may be configured to operate the amplifier 140 to supply the current to the second speaker 160 corresponding to the voice received from the terminal of the rescue center, such as a police station or a fire station.

Accordingly, when the vibrating plate 161 of the second speaker 160 vibrates according to the operation of the voice coil according to the current supply, a pressure change in the internal space 105 is caused, and thus the vibrating plate 151 of the first speaker 150 may cause vibration. In general, the controller 130 may be configured to operate the amplifier 140 to supply the current to the second speaker 160 when an accident occurs, on the other hand, the controller 130 may be configured to operate the amplifier 140 so that current is not supplied to the first speaker 150.

However, if the current is continuously supplied to the first speaker 150 due to an error due to an accident, the sound output from the second speaker 160 may be distorted by the sound from the first speaker 150. Specifically, the controller 130 may be configured to receive an accident occurrence signal from components (e.g., airbags, Ecall units) in vehicle 10 when an accident occurs, the current supply to the first speaker 150 may be stopped so that only the second speaker 160 operates.

However, depending on the degree of damage to the vehicle 10 in the event of an accident, the wired connection or the wireless connection between the component in the vehicle 10 that transmits the accident signal to the controller 130 and the controller 130 may be disconnected. In particular, the controller 130 may not receive an accident occurrence signal, and may continue to supply current to the first speaker 150. Accordingly, it may be possible to stop the supply of current to the first speaker 150 by recognizing the occurrence of an accident even when the wired connection or the wireless connection between the component 130 in the vehicle 10 that transmits the accident occurrence signal to the controller 130 and the controller 130 is disconnected.

The controller 130 may be configured to determine whether current is induced to the first speaker 150 according to the operation of the second speaker 160 based on the output of the detector 110. In response to determining that the current is induced to the first speaker 150 according to the operation of the second speaker 160, the controller 130 may be configured to determine that an accident has occurred and operate the amplifier 140 so that no current is supplied to the first speaker 150. At this time, the controller 130 may be configured to compare the current of the first speaker 150 according to the pre-stored induction current information and the output of the detector 110, determine whether current is induced in the first speaker 150 according to the operation of the second speaker 160.

In other words, the controller 130 may be configured to determine that an accident has occurred, and operate the amplifier 140 so that current is not supplied to the first speaker 150 when the current induced in the first speaker 150 is different from the current induced in the general situation based on the induced current information, which is information regarding the current induced in the general situation, not an accident. At this time, the controller 130 may be configured to determine the current induced by the first speaker 150 based on the difference between the current corresponding to the acoustic signal supplied to the first speaker 150 and the current sensed by the detector 110.

As described above, if the first speaker 150 continuously outputs sound in the event of an accident, it may be possible to block the current supplied to the first speaker 150 to prevent sound distortion in the second speaker 160. Hereinafter, a control method of vehicle 10 according to an exemplary embodiment will be described. The vehicle 10 according to the above-described exemplary embodiment may be applied to the control method of vehicle 10 described later. The method described herein below may be executed by a controller. Therefore, the contents described with reference to FIGS. 1 to 6 may be applied to the control method of the vehicle 10 according to an exemplary embodiment even if there is no special mention.

Figure 6:
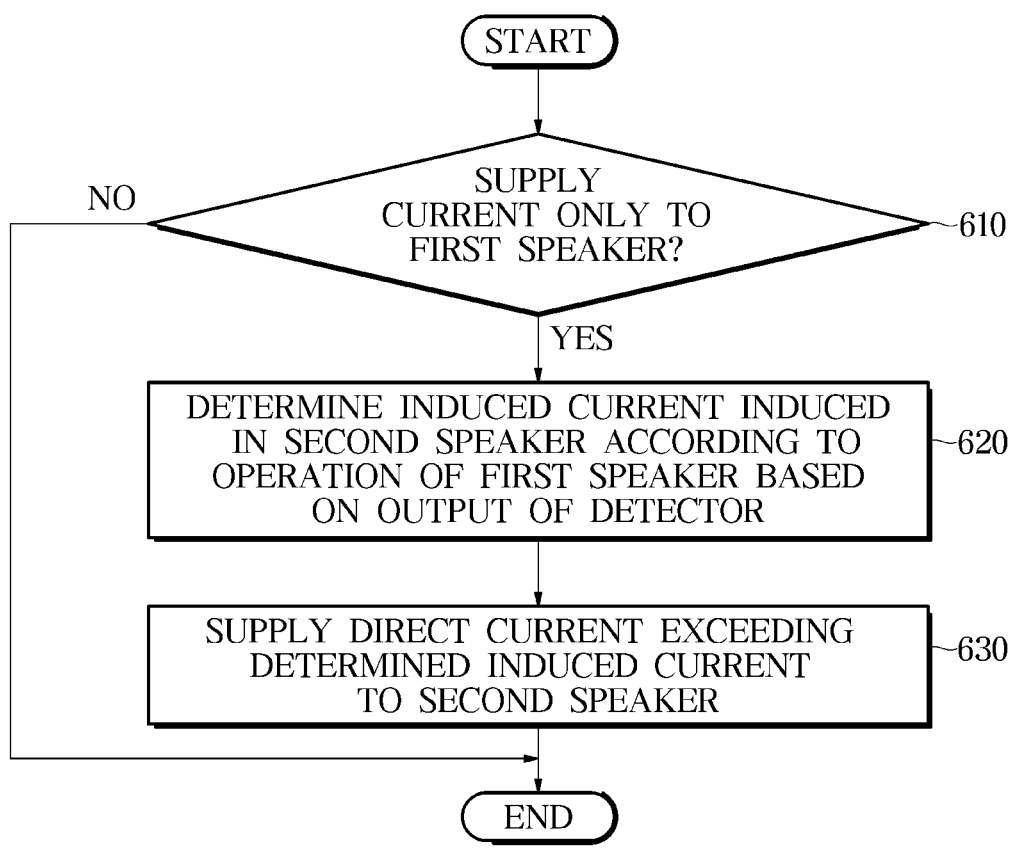
FIG. 6 is a flowchart illustrating a case in which the operation of the second speaker is prevented in a control method of a vehicle according to an exemplary embodiment.

FIG. 6 is a flowchart illustrating a case in which the operation of the second speaker 160 is prevented in a control method of a vehicle 10 according to an exemplary embodiment. Referring to FIG. 6, vehicle 10 according to an exemplary embodiment, when current is supplied only to the first speaker 150 (YES in 610), the induced current induced in the second speaker 160 may be determined according to the operation of the first speaker 150 based on the output of the detector 110 (620).

The vehicle 10 according to an exemplary embodiment may be configured to supply a direct current exceeding the determined induced current to the second speaker 160 (630). In other words, the vehicle 10 may be configured to operate the amplifier 140 to supply the DC coil of the second speaker 160 with a DC current exceeding the maximum amount of the induced current induced in the second speaker 160, so that the second speaker (By vibrating plate 161 of 160) is fixed in a direction corresponding to the direct current, it may be possible to prevent the vibrating plate 161 from vibrating according to the induced current. Thus, the vehicle 10, by supplying a direct current to prevent the operation of the second speaker 160, prevents generating noise in the output from the first speaker 150.

Figure 7:
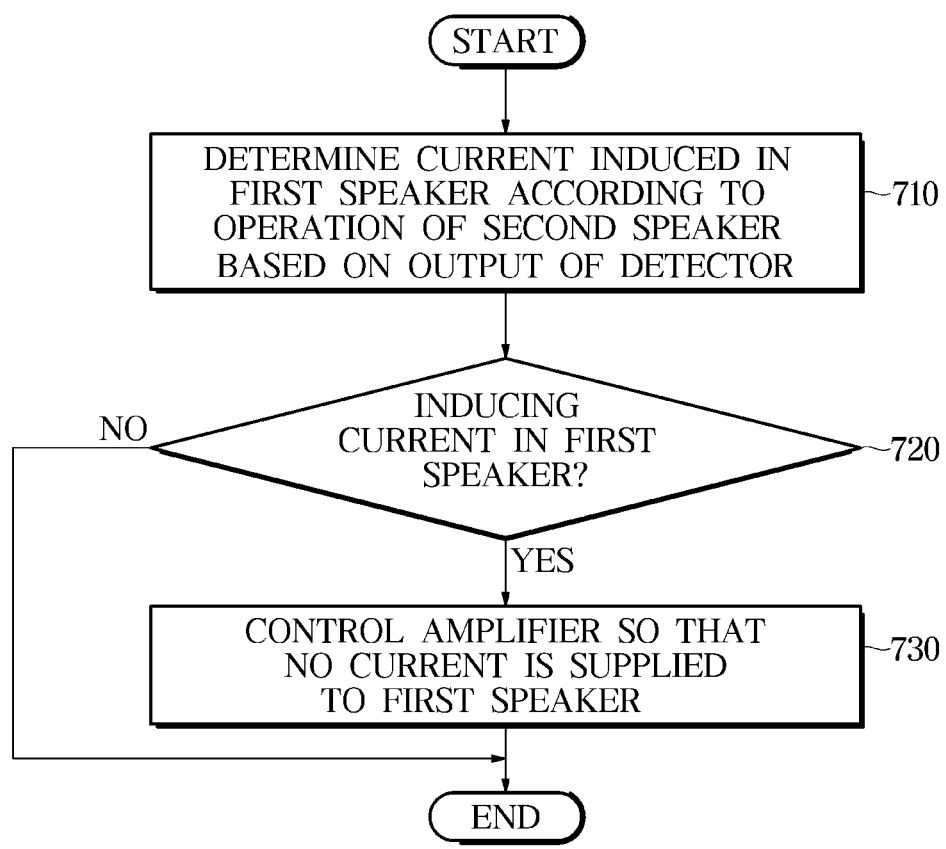
FIG. 7 is a flowchart illustrating a case in which an operation of the first speaker is prevented when an accident occurs in a control method of a vehicle according to an exemplary embodiment.

FIG. 7 is a flowchart illustrating a case in which an operation of the first speaker 150 is prevented when an accident occurs in a control method of a vehicle according to an exemplary embodiment. Referring to FIG. 7, the vehicle 10 may be configured to determine whether a current is induced to the first speaker according to the operation of the second speaker 160 based on the output of the detector 110 (710). The vehicle 10 according to an exemplary embodiment may be configured to operate the amplifier 140 so that current is not supplied to the first speaker 150 when a current is induced to the first speaker 150 (YES in 720) (730).

Specifically, the controller 130 may be configured to receive an accident occurrence signal from components (e.g., airbags, Ecall units) in vehicle 10 when an accident occurs, and stop supplying current to the first speaker 150 so that only the second speaker 160 operates. However, depending on the degree of damage to the vehicle 10 in the event of an accident, the wired connection or the wireless connection between the component in the vehicle 10 that transmits the accident signal to the controller 130 and the controller 130 may be disconnected. In particular, the controller 130 may not receive an accident occurrence signal, and may continue to supply current to the first speaker 150.

Accordingly, the controller 130 may be configured to recognize the occurrence of an accident even in a situation in which a wired connection or a wireless connection between a component in the vehicle 10 that transmits an accident occurrence signal to the controller 130 and the controller 130 is disconnected. Then, the controller 130 may be configured to determine whether current is induced to the first speaker 150 according to the operation of the second speaker 160 based on the output of the detector 110 to stop the current supply to the first speaker 150. Additionally, when the current is induced to the first speaker 150 according to the operation of the second speaker 160, the controller 130 may be configured to determine that an accident has occurred and operate the amplifier 140 so that no current is supplied to the first speaker 150.

In other words, vehicle 10 may be configured to determine whether current is induced to the first speaker 150 according to the operation of the second speaker 160 based on the output of the detector 110, and may be configured to determine that an accident has occurred and operate the amplifier 140 so that no current is supplied to the first speaker 150 when the current is induced to the first speaker 150 according to the operation of the second speaker 160. At this time, the vehicle 10 may be configured to compare pre-stored induction current information and the current of the first speaker 150 according to the output of the detector 110, and then determine whether the current is induced at the first speaker 150 according to the operation of the second speaker 160.

The vehicle 10 may be configured to determine that an accident has occurred, and operate the amplifier 140 so that current is not supplied to the first speaker 150 in response to determining that the current induced in the first speaker 150 is different from the current induced in the general situation based on the induced current information, which is information regarding the current induced in the general situation, not an accident. At this time, the controller 130 may be configured to determine the current induced by the first speaker 150 based on the difference between the current corresponding to the acoustic signal supplied to the first speaker 150 and the current sensed by the detector 110.

As described above, if the first speaker 150 continuously outputs sound in the event of an accident, it may be possible to block the current supplied to the first speaker 150 to prevent sound distortion in the second speaker 160. On the other hand, the above-mentioned exemplary embodiments may be implemented in the form of a recording medium storing commands capable of being executed by a computer system. The commands may be stored in the form of program code. When the commands are executed by the processor, a program module is generated by the commands so that the operations of the disclosed embodiments may be carried out. The recording medium may be implemented as a non-transitory computer-readable recording medium.

The non-transitory computer-readable recording medium includes all types of recording media storing data readable by a computer system. Examples of the computer-readable recording medium include a Read Only Memory (ROM), a Random Access Memory (RAM), a magnetic tape, a magnetic disk, a flash memory, an optical data storage device, or the like.

Although a few exemplary embodiments of the present disclosure have been shown and described, it would be appreciated by those skilled in the art that changes may be made in these exemplary embodiments without departing from the principles and spirit of the disclosure, the scope of which is defined in the claims and their equivalents.

In accordance with an aspect of the present disclosure, it may be possible to provide a vehicle and a controlling method thereof capable of providing efficient autonomous driving by changing the detection range and power consumption of the sensor according to the speed of the vehicle.

What is claimed is:

1. A vehicle, comprising:
   a crush pad;
   a first speaker and a second speaker provided in the crush pad to share the internal space of the crush pad as an enclosure;
   an amplifier configured to supply current to the first speaker and the second speaker;
   a detector configured to detect the current of the first speaker and the current of the second speaker; and
   a controller configured to supply a compensation current to the second speaker to prevent a movement of the second speaker caused by an operation of the first speaker based on an output of the detector when a current is supplied to the first speaker among the first speaker and not to the second speaker.

2. The vehicle according to claim 1, wherein the controller is configured to determine an induced current induced in the second speaker according to the operation of the first speaker based on the output of the detector.

3. The vehicle according to claim 2, wherein the controller is configured to operate the amplifier to supply a direct current (DC) current exceeding the induced current to the second speaker.

4. The vehicle according to claim 1, wherein the controller is configured to operate the amplifier so that the first speaker outputs sound corresponding to an audio/video/navigation (AVN) device.

5. The vehicle according to claim 1, wherein the controller is configured to operate the amplifier so that the second speaker outputs received sound from an external device when an accident occurs.

6. The vehicle according to claim 5, wherein the controller is configured to operate the amplifier so that the current is not supplied to the first speaker when the accident occurs.

7. The vehicle according to claim 6, wherein the controller is configured to determine whether the current is induced in the first speaker according to the operation of the second speaker based on the output of the detector.

8. The vehicle according to claim 7, wherein the controller is configured to operate the amplifier so that current is not supplied to the first speaker in response to determining that an accident has occurred when current is induced in the first speaker.

9. The vehicle according to claim 7, wherein the controller is configured to determine whether the current is induced in the first speaker according to the operation of the second speaker by comparing a pre-stored induced current information and the current of the first speaker according to the output of the detector.

10. A controlling method of a vehicle including a crush pad, a first speaker and a second speaker provided in the crush pad to share the internal space of the crush pad as an enclosure, an amplifier configured to supply current to the first speaker and the second speaker, a detector configured to detect the current of the first speaker and the current of the second speaker, the method comprising:

supplying, by a controller, a compensation current to the second speaker to prevent a movement of the second speaker caused by an operation of the first speaker based on an output of the detector when a current is supplied to the first speaker and not to the second speaker.

11. The method according to claim 10, wherein compensating the movement of the second speaker includes determining an induced current induced in the second speaker according to the operation of the first speaker based on the output of the detector.

12. The method according to claim 11, wherein compensating the movement of the second speaker includes operating the amplifier to supply a direct current (DC) current exceeding the induced current to the second speaker.

13. The method according to claim 10 further comprising: operating the amplifier so that the first speaker outputs sound corresponding to an audio/video/navigation (AVN) device.

14. The method according to claim 10 further comprising: operating the amplifier so that the second speaker outputs received sound from an external device when an accident occurs.

15. The method according to claim 14 further comprising: operating the amplifier so that the current is not supplied to the first speaker when the accident occurs.

16. The method according to claim 15, wherein operating the amplifier so that the current is not supplied to the first speaker includes determining whether the current is induced in the first speaker according to the operation of the second speaker based on the output of the detector.

17. The method according to claim 16, wherein operating the amplifier so that the current is not supplied to the first speaker includes operating the amplifier so that current is not supplied to the first speaker in response to determining that an accident has occurred when current is induced in the first speaker.

18. The method according to claim 16, wherein determining whether the current is induced in the first speaker includes determining whether the current is induced in the first speaker according to the operation of the second speaker by comparing a pre-stored induced current information and the current of the first speaker according to the output of the detector.

* * * * *